April 2, 1968 W. G. DILLEY 3,376,515

SINGLE-ENDED, PUSH-PULL TRANSISTOR AUDIO AMPLIFIER

Filed March 5, 1965

INVENTOR.
WILLIAM G. DILLEY

BY Mallinckrodt and Mallinckrodt

ATTORNEYS

United States Patent Office 3,376,515
Patented Apr. 2, 1968

3,376,515
SINGLE-ENDED, PUSH-PULL TRANSISTOR AUDIO AMPLIFIER
William G. Dilley, 4168 North 425 West, Ogden, Utah 84404
Filed Mar. 5, 1965, Ser. No. 437,497
4 Claims. (Cl. 330—15)

ABSTRACT OF THE DISCLOSURE

A wide band, audio amplifier characterized by low distortion and low noise. Transistorized input circuitry of common base configuration enables feedback to be applied directly to the transistor base from a network arranged to perform the functions of AC feedback and DC bias. A differential amplifier also operates in the common base mode. A single ended, push-pull output stage includes symmetrical portions utilizing respective transistors operating in the common emitter mode.

This invention relates to audio amplifier circuitry utilizing transistors and has as its purpose the provision of a low distortion, wide band, low-noise, audio amplifier at low cost.

The amplifier of the invention is a versatile, solid-state, single circuit intended specifically for recording and broadcast audio systems. It performs the functions of microphone pre-amplifier, booster-amplifier, and program amplifier, thus fulfilling all amplifier requirements within an audio control system. The unique circuitry makes possible a frequency response to one megacycle while utilizing low cost transistors. It can be used as a power amplifier, and may be configured for either a positive or negative power supply by choice of PNP and NPN transistors.

With the exception of complementary push-pull circuits, the normal transistor driver or phase splitter of a single-ended, push-pull, transistor amplifier circuit has two different output impedances, because it drives simultaneously from the emitter and the collector. The unequal source impedances feeding the push-pull output stage produce distortion of significant magnitude.

In accordance with this invention, a symmetrical driving input is provided by means of a single differential amplifier. The identical impedance drivers to the final push-pull stage of such amplifier make for very low distortion, e.g., in the order of 0.01% total harmonic distortion over a band width of 20 to 20,000 cycles.

With respect to frequency response, the normal common emitter configuration requires a wide band transistor, which necessitates use of an expensive transistor to satisfy this requirement. In accordance with this invention, however, an extremely wide band, e.g., one megacycle, is achieved by utilizing a transistor in the common base mode. This enables the use of an inexpensive transistor.

Noise from the common base configuration is much lower than from the common emitter configuration. Moreover, since feedback can be applied directly to the transistor base, it is possible in this configuration to obtain a low input impedance without dissipating feedback and without the use of a series resistance at the input.

One of the factors influencing noise (hum) in an amplifier is the AC content of the DC power supply. To eliminate the need for a battery power supply or a sophisticated electronic power to avoid the effect of AC ripple upon the amplifier, the circuit of this invention is designed to be insensitive to power supply fluctuations. To this end, the DC biasing is accomplished through the feedback loop, and, therefore, variations in power supply voltage do not appear in the circuit as signal, except at the base of $Q_3$. The hum appearing at the output of the amplifier from this source is a direct linear function of the ratio of the voltage divider consisting of $D_1$, $D_2$, $D_3$ versus $R_4$. Normal values in this circuit provide for a B+ ripple attenuation on the order of 35 db.

All of these noise considerations combine to make a noise specification of better than —125 dbm (noise output expressed in terms of signal input, 20 to 20 kc.) readily obtainable with the amplifier of this invention.

There is shown in the accompanying drawing a specific embodiment of the invention representing what is presently regarded as the best mode of carrying it out in practice. From the following detailed description of such embodiment, other more specific objects and features of the invention will be apparent.

Figure 1:
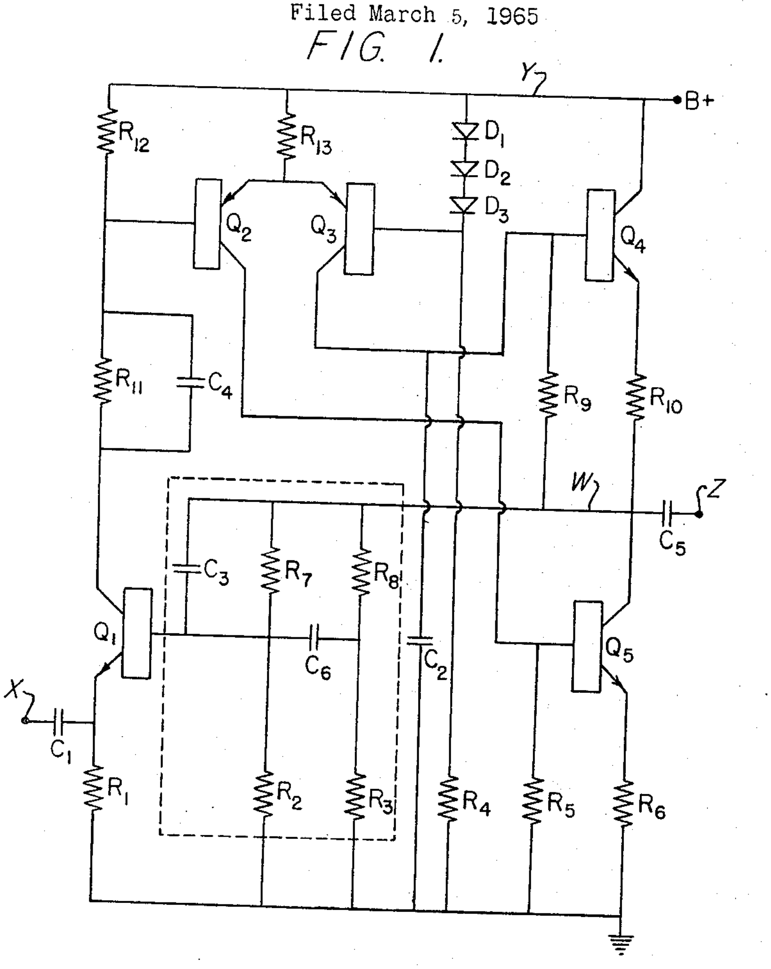
FIG. 1 is a circuit diagram showing a preferred form the invention.

Referring to the drawing:

There is shown a single-ended, push-pull, transistor audio amplifier circuit comprising an input stage, which includes a resistor $R_1$ for matching input signals applied at X with a standard line impedance (usually 600 ohms). A transistor $Q_1$, here shown as of NPN type and preferably being of low-cost germanium construction, is connected to operate in the common base mode, and a DC-blocking capacitor $C_1$ is interposed between the signal input and such resistor and transistor.

Input feed to transistor $Q_1$ is to the emitter thereof. A resistance $R_{11}$ and capacitor $C_4$, connected in parallel, are interposed in the line Y supplying voltage from power source B+ to the collector of the transistor, for dropping the voltage to such collector and thereby insuring low-noise operation. A capacitor $C_4$ compensates for the collector capacity of transistor $Q_1$. In order to adjust the current through transistor $Q_1$ and as a source impedance to $Q_2$, both of these to optimize noise, a resistor $R_{12}$ is interposed in the power-supplying line Y.

Operating the transistor $Q_1$ in the common base mode allows a very high open loop gain in this input stage, as well as common base frequency response and low noise.

The circuitry comprises a second stage, which is a differential amplifier. It includes a differential pair of similar but not necessarily identical transistors $Q_2$ and $Q_3$. In the illustrated arrangement, these transistors are of PNP type. Diode means, here shown as three individual diodes $D_1$, $D_2$, and $D_3$ (in preference to a Zener diode for lower noise operation and lower cost), and a resistor $R_4$ are provided in circuit with the differential transistors $Q_2$ and $Q_3$ to form a voltage reference therefor.

This second stage forms a differential amplifier that allows symmetrical portions of the third or output stage to be driven identically but in mutually opposite phase. The signal from the first, or input, stage is fed to this differential amplifier of the second stage from transistor $Q_1$ through resistance $R_{11}$ and capacitor $C_4$.

The transistors $Q_2$ and $Q_3$ are, like transistor $Q_1$, connected to operate in the common base mode, so that extended frequency response and low noise can be achieved, even though such transistors may be of low-cost, germanium construction.

The output, or third, stage of the amplifier is designed to provide completely symmetrical output with low distortion, and is, in effect, a push-pull stage. As illustrated, it includes symmetrical portions at respectively opposite sides of an output connection Z, such portions including a pair of identical transistors $Q_4$ and $Q_5$, respectively, operating in the common emitter mode, so that they can be of low cost silicon construction without jeopardizing the frequency response of the amplifier. In the illustrated embodiment, they are NPN type. For DC stabilization and equalization and, also, to provide a small amount of feed-back, resistors $R_{10}$ and $R_6$ are connected to the emitters of the respective transistors.

A capacitor $C_2$ is provided in circuit with the two transistors $Q_4$ and $Q_5$ to minimize any tendency toward instability or oscillation by limiting frequency response of this output stage, which also includes an output circuit W having a DC-blocking capacitor $C_5$ isolating the output load.

Bias on this output stage is determined by resistors $R_9$ and $R_5$, in the respective symmetrical output portions thereof, by a resistor $R_{13}$, and by the voltage on the base of transistor $Q_3$. Resistors $R_9$ and $R_5$ have resistance values low enough so that, together with the differential pair of transistors $Q_2$ and $Q_3$, they form identical voltage drivers for the output stage.

A network (enclosed by broken lines in FIG. 1) provides AC feedback to the input stage and DC bias for all the stages. It includes resistors $R_8$ and $R_3$ for AC feedback, and resistors $R_7$ and $R_2$ to bias transistor $Q_1$ DC-wise. The latter resistors have high impedance, e.g. ten times, compared to the former. A coupling capacitor $C_6$ allows AC feedback into transistor $Q_1$. It should be noted that the ratio of $R_8$ to $R_3$ determines the gain of the amplifier, independently of the other parameters. For high frequency damping, a very small capacitor $C_3$ is provided.

It should be noted that, normally, the input impedance of transistor $Q_1$ would be very low, but the feedback into its base raises such input impedance to that of resistance $R_1$.

The major advantages of this network are:

(a) The network configuration allows the AC and the DC feedback ratios to be selected separately while still being supplied from the same source.

(b) The capacitance for $C_6$ can be small compared to the conventional method of biasing ($C_6$ is terminated by very large impedance).

(c) The DC biasing ratio may be selected so that complete biasing can be accomplished utilizing the output stage for the biasing source (circuit becomes independent of the supply voltage, and thus independent of the ripple contained within the supply).

Figure 2:
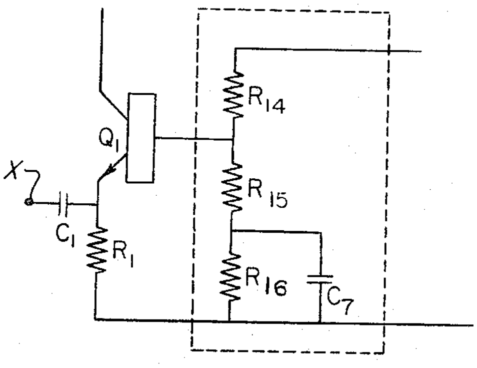
FIG. 2 is a fragmentary portion of such diagram showing an alternate form of the AC feedback and DC bias network.

Although the specific network shown is a superior one, the same results could be approached in a variety of ways well known to those skilled in the art. For example, FIG. 2 illustrates a network (enclosed by broken line) consisting of three resistors $R_{14}$, $R_{15}$, and $R_{16}$ and one capacitor $C_7$. The DC bias is determined by these resistors and the AC feedback is determined by all components.

It is to be understood that, for use with a negative power supply, the designated PNP and NPN transistors will be reversed.

Whereas there is here illustrated and specifically described a certain preferred construction of apparatus which is presently regarded as the best mode of carrying out the invention, it should be understood that various changes may be made and other constructions adopted without departing from the inventive subject matter particularly pointed out and claimed herebelow.

I claim:

1. A transistor audio amplifier characterized by low distortion, wide band frequency response, and low noise, comprising:

an input stage including
- a resistor for matching input signals with a standard line impedance;
- a transitor operating in the common base mode;
- a DC blocking capacitor connected in series circuit with said resistor and said transistor for feeding the input signals thereto, the feed to the transistor being to the emitter thereof;
- a line for connecting a power source to the collector of said transistor;
- a collector load resistor in series with said line; and
- means in said line for dropping the voltage applied to said collector to achieve low noise operation;

a second stage including
- a differential amplifier having
  - a differential pair of similar transistors, each operating in the common base mode, and diode means and a resistor in circuit with the emitter-base circuit of said pair of transistors to form a voltage reference therefor;

an output stage including
- a pair of transistors operating in the common emitter mode;
- resistors in the base circuit of said transistors to effect equal DC bias and AC voltage drive;
- resistors in the input circuit of said transistors to effect DC stabilization, equalization, and some feedback;
- a capacitor in the input circuit of said transistors for limiting the frequency response of said output stage;
- an output circuit having a DC-blocking capacitor isolating the output load; and a network
- connected between said output circuit and the base of the first stage transistor,
- so as to perform the functions of AC feedback and DC bias.

2. A transistor audio amplifier as recited in claim 1, wherein a resistor is interposed in the power supply line for controlling current supply to the transistor of the input stage and determining the source impedance to the second stage.

3. A transistor audio amplifier as recited in claim 1, wherein the means for dropping the voltage applied to the collector of the transistor of the input stage comprises a resistor and capacitor connected in parallel in the collector circuit.

4. A transistor audio amplifier as recited in claim 1, wherein the network includes a pair of resistors forming a divider for AC feedback, the voltage division point being connected to the DC blocking capacitor, whereby the ratio of said resistors determines the gain of the circuit; a capacitor providing high frequency condensation; and a pair of resistors forming a divider for DC feedback and providing DC bias for the input stage, the last-named resistors having a high impedance relative to the first-named resistors.

No references cited.

ROY LAKE, *Primary Examiner.*

E. C. FOLSOM, *Assistant Examiner.*